United States Patent
Mimlitch, III et al.

(10) Patent No.: US 8,913,393 B2
(45) Date of Patent: Dec. 16, 2014

(54) WALL-MOUNTABLE SUPPORT RACK FOR EQUIPMENT

(75) Inventors: Robert H. Mimlitch, III, Rowlett, TX (US); Jeffrey R. Waegelin, Rockwall, TX (US); Michael Cummings, Royse City, TX (US)

(73) Assignee: Innovation First, Inc., Greenville, TX (US)

( * ) Notice: Subject to any disclaimer, the term of this patent is extended or adjusted under 35 U.S.C. 154(b) by 227 days.

(21) Appl. No.: 13/597,398

(22) Filed: Aug. 29, 2012

(65) Prior Publication Data

US 2013/0091689 A1 Apr. 18, 2013

Related U.S. Application Data

(60) Provisional application No. 61/547,801, filed on Oct. 17, 2011.

(51) Int. Cl.
*H05K 7/14* (2006.01)

(52) U.S. Cl.
CPC ................................ *H05K 7/1488* (2013.01)
USPC .......... 361/724; 211/26; 211/87.01; 248/317; 312/223.1

(58) Field of Classification Search
USPC ........... 29/525.01; 211/26, 86.01, 87.01, 189, 211/182; 312/265.1–265.6, 223.1; 361/724, 361/728–730, 807, 809, 825, 829; 248/317
See application file for complete search history.

(56) References Cited

U.S. PATENT DOCUMENTS

| | | | | |
|---|---|---|---|---|
| 5,485,932 | A * | 1/1996 | Romm et al. | 211/87.01 |
| 5,540,339 | A * | 7/1996 | Lerman | 211/26 |
| 5,542,549 | A * | 8/1996 | Siemon et al. | 211/26 |
| 5,749,476 | A * | 5/1998 | Besserer et al. | 211/26 |
| 5,806,687 | A * | 9/1998 | Ballesteros et al. | 211/26 |
| 6,065,612 | A * | 5/2000 | Rinderer | 211/26 |
| 6,123,400 | A * | 9/2000 | Nicolai et al. | 312/265.1 |
| 6,467,640 | B1 * | 10/2002 | Hung | 220/4.02 |
| 6,502,702 | B1 * | 1/2003 | Hsue et al. | 211/26 |
| 6,762,360 | B2 * | 7/2004 | Wright | 174/50 |
| 6,814,244 | B1 * | 11/2004 | Hathcock | 211/26 |
| 7,293,666 | B2 * | 11/2007 | Mattlin et al. | 211/189 |
| 2008/0144293 | A1 * | 6/2008 | Aksamit et al. | 361/727 |
| 2010/0328872 | A1 * | 12/2010 | Chou et al. | 361/679.08 |
| 2012/0193308 | A1 * | 8/2012 | Wagner et al. | 211/26 |
| 2012/0273438 | A1 * | 11/2012 | Nordin et al. | 211/26 |
| 2013/0091689 | A1 * | 4/2013 | Mimlitch et al. | 29/525.01 |
| 2013/0213907 | A1 * | 8/2013 | Masse et al. | 211/26 |

* cited by examiner

*Primary Examiner* — Jennifer E Novosad
(74) *Attorney, Agent, or Firm* — Adam K. Sacharoff; Much Shelist

(57) ABSTRACT

A wall mountable rack for equipment, and an associated method of assembly for the rack and a method of use for the rack is disclosed. Exemplary equipment that may be mounted in the rack includes power strips, patch panels, servers, tower computers, tape drives, hubs, switches, cabling and other equipment related thereto.

15 Claims, 9 Drawing Sheets

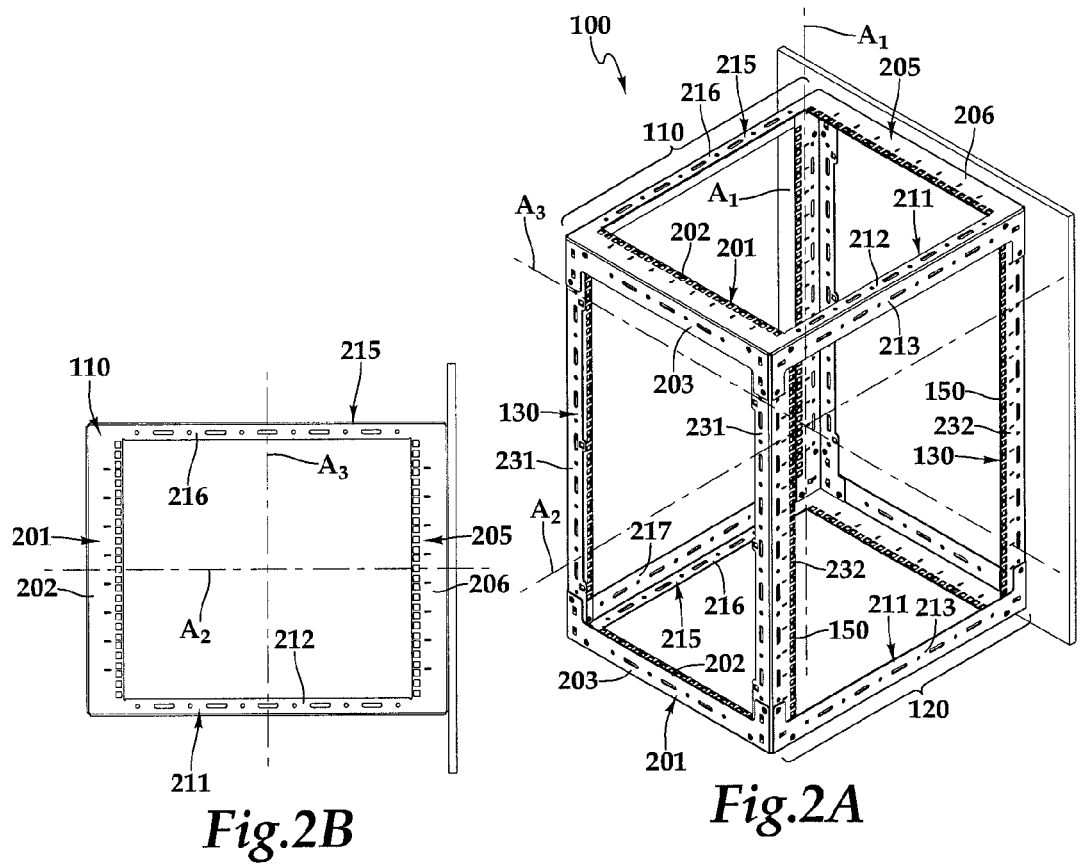
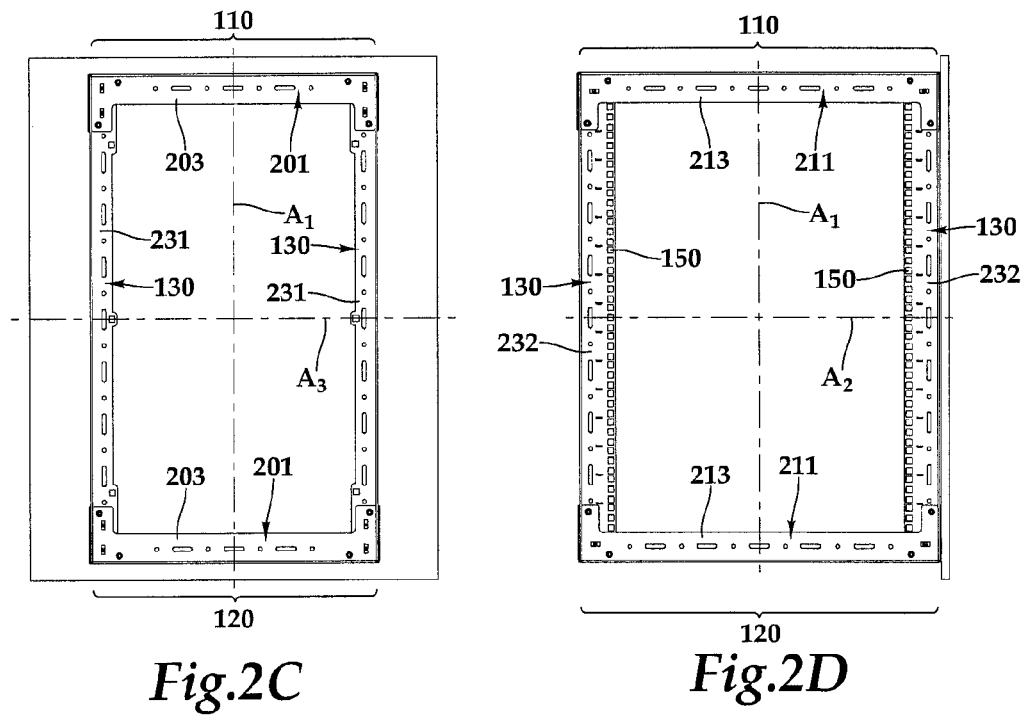
Fig.2B  Fig.2A
Fig.2C  Fig.2D

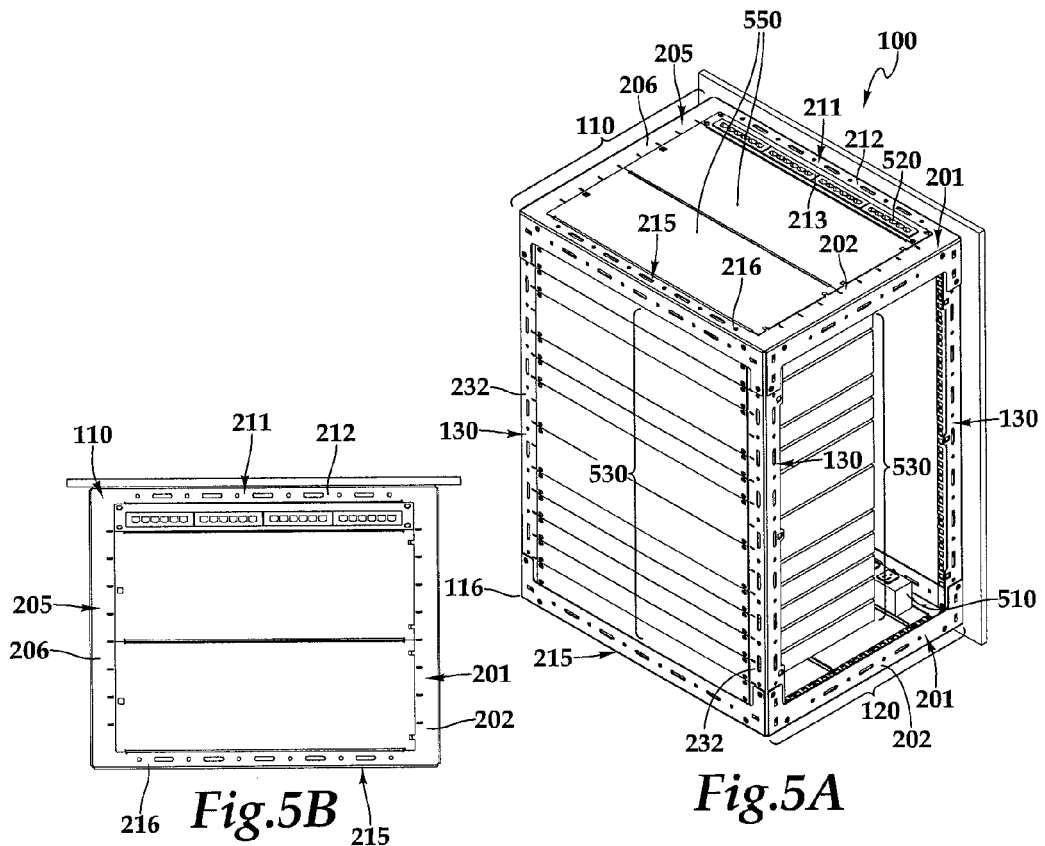
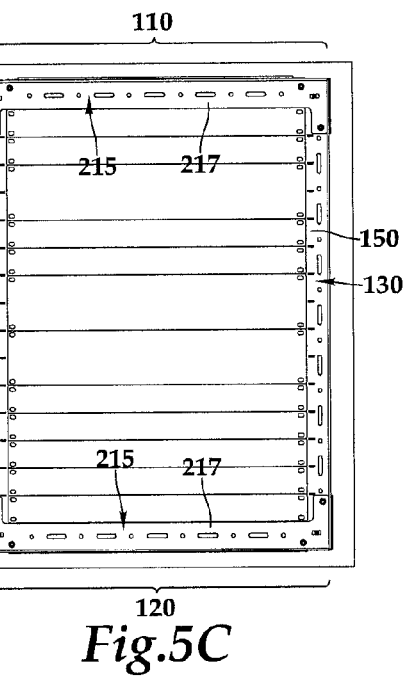
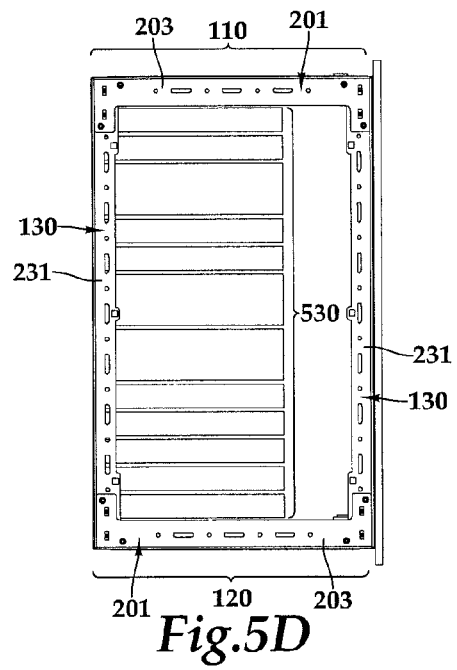
Fig.5A
Fig.5B
Fig.5C
Fig.5D

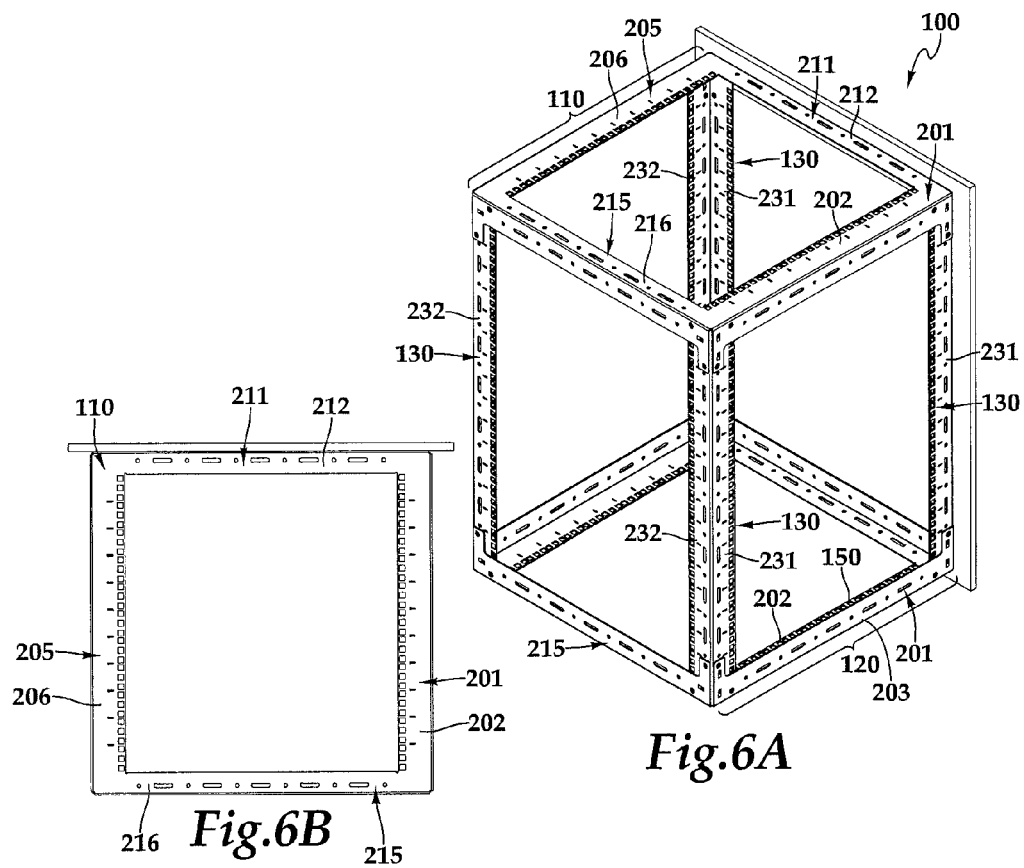
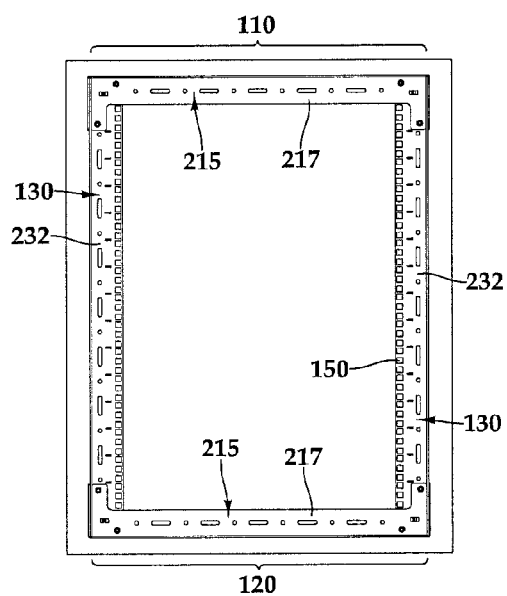

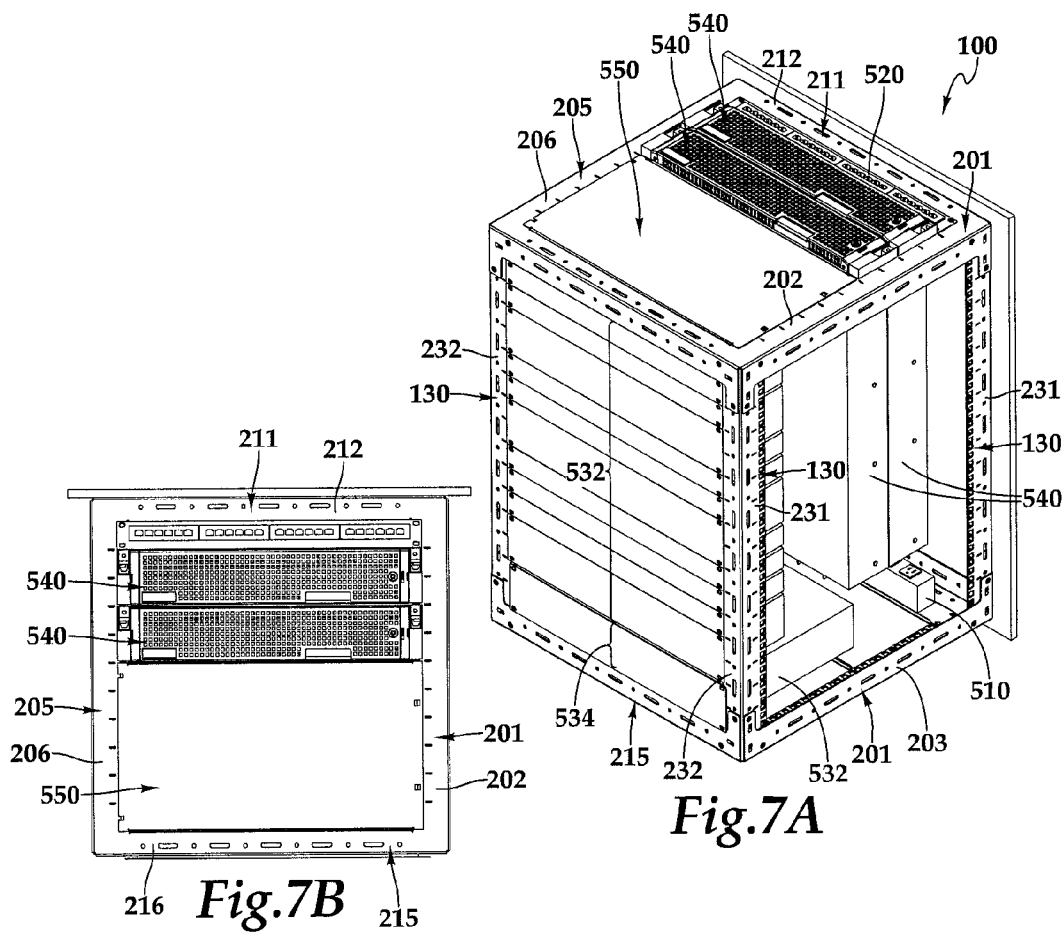
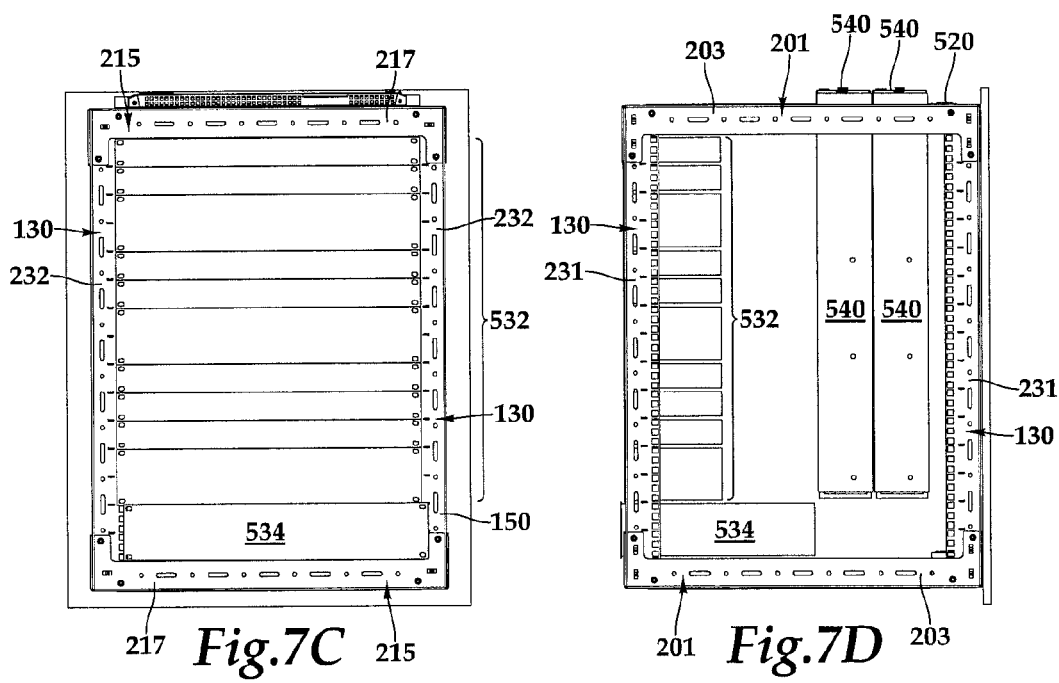

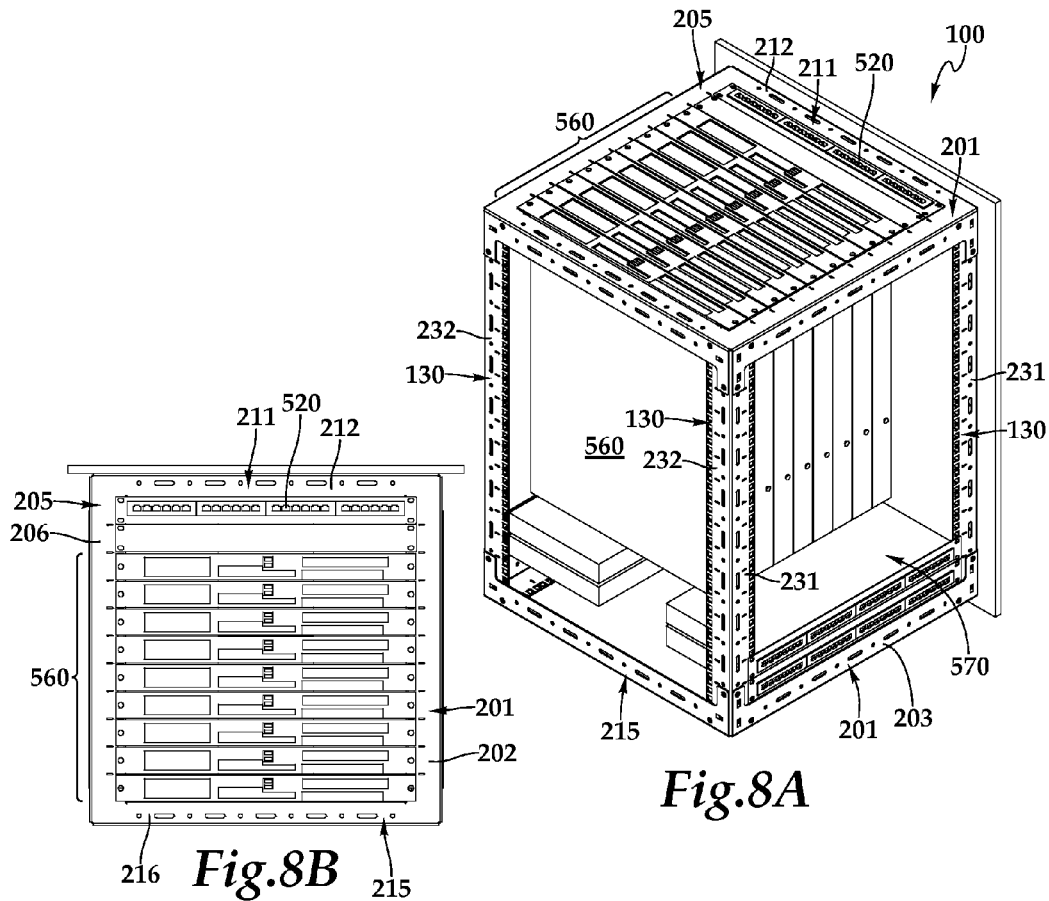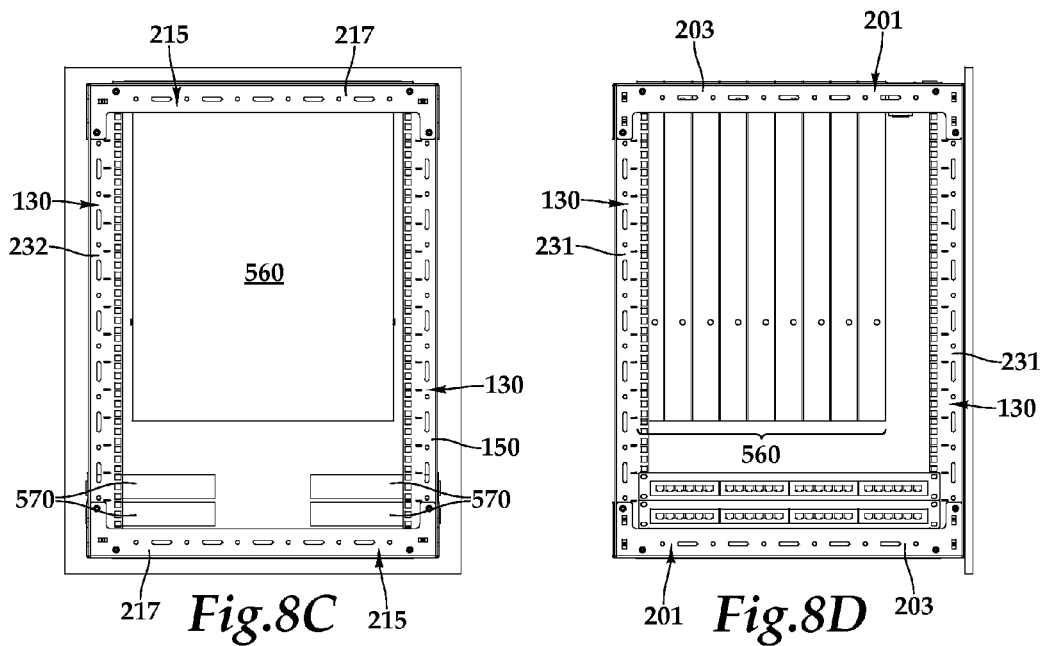

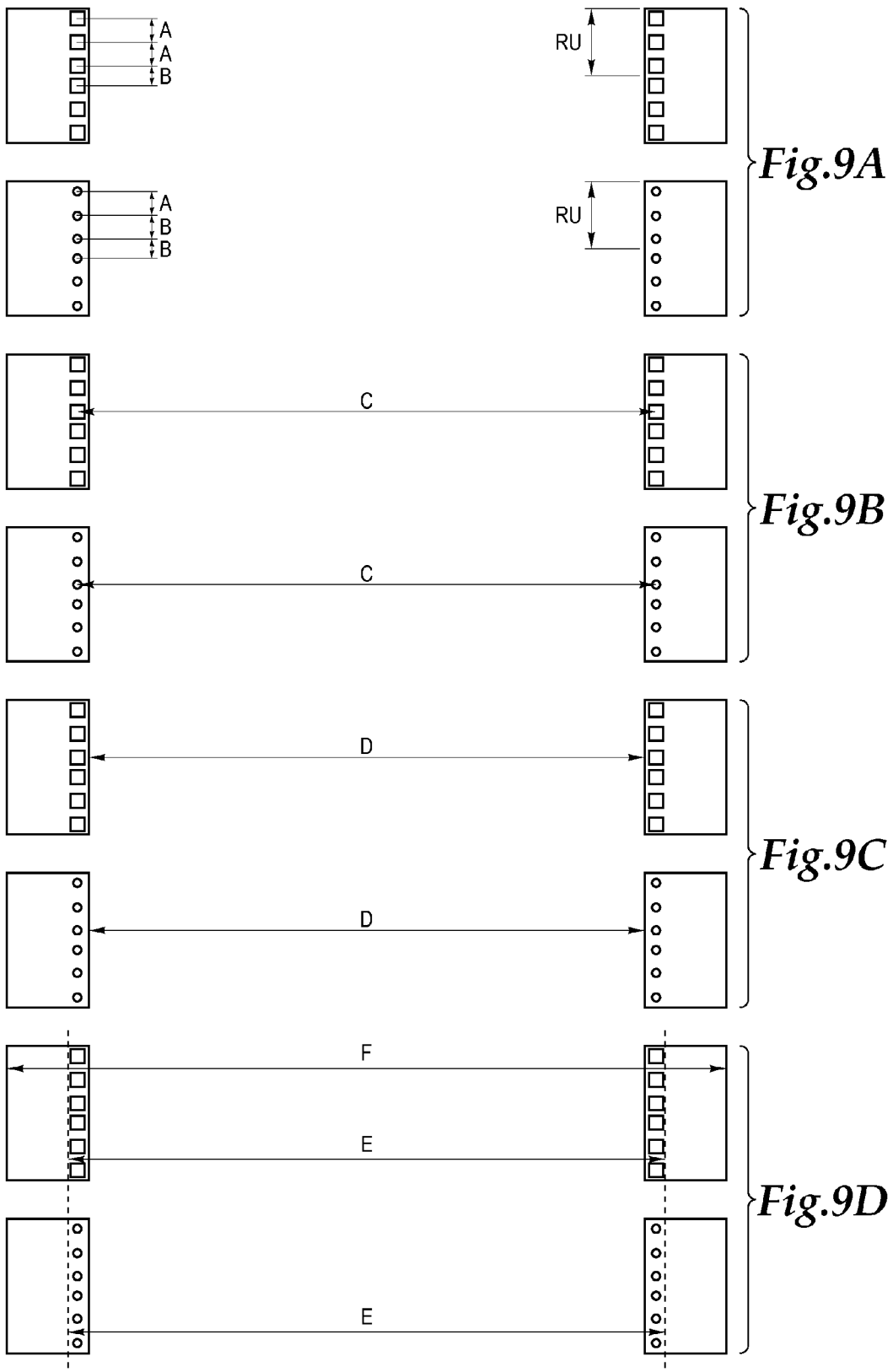

WALL-MOUNTABLE SUPPORT RACK FOR EQUIPMENT

CLAIM OF PRIORITY

This application claims priority under 35 USC §119(e) to U.S. Patent Application Ser. No. 61/547,801, entitled "Wall-Mountable Support Rack for Equipment," filed on Oct. 17, 2011, which is incorporated herein by reference in its entirety.

BACKGROUND

Technical Field

The present invention relates to a support rack, and more particularly to a wall-mountable rack for supporting equipment, such as electronic equipment, and a method of assembly and method of use for the support rack.

The physical support of objects or devices (e.g., electronic equipment) presents a number of related issues. For purposes of this application, the term "equipment" shall be used to include, without limitation, computers (of all designs, including servers, desktops and towers), computer components, tape drives, tape backups, hubs, switches, power strips, patch panels, cabling, audio/visual components, and the like.

It is generally desirable to support equipment in a rack in a manner that facilitates its operation, if applicable. For example, such support should orient the equipment in proper or recommended spatial orientation. Other orientation may be dictated by functional features of the equipment (e.g., placement of cooling fan inside the equipment) or other considerations. Next, support should be accomplished in a manner that consumes the smallest amount of space, but still provides the user with a desired level of access. Such access may be necessary to monitor, control and/or maintain the equipment being supported. With modern office and storage space at a premium, the development of racks and other stacking devices for such equipment is desirable.

The Electronics Industry Association (EIA) has promulgated EIA standard EIA 310-D for vertical hole spacing and horizontal hole spacing (hereinafter referred to as "EIA mounting apertures") for standard equipment rack mounting systems. The EIA 310-D standard may be obtained from the Electronics Industry Association and at present may be ordered on line at http://electronics.ihs.com/collections/eia/index.htm. Below is a brief summary of some of the information in the standard:

Vertical Hole Spacing

The vertical spacing of the vertical rows of mounting apertures is specified by EIA-310D as a repeating pattern of apertures within one Rack Unit ("RU") of 1.75". The aperture spacing A=⅝" (0.625") (15.90 mm); A=⅝" (0.625") (15.90 mm); B=½" (0.50") (12.70 mm); A=⅝"; B=½" and repeats. The mounting apertures may be circular holes or square or rectangular slots. See FIG. 9A.

Horizontal Spacing

The horizontal spacing of the vertical rows of apertures is specified by EIA 310-D at C=18 5/16" (18.312") (465.1 mm) from center to center aperture dimension (see FIG. 9B).

The EIA 310-D Standard also provides recommendations for rack openings for standard equipment racks.

Rack Opening

The inside dimension D of the opening in the rack is specified as a minimum of 17.72" (450 mm). Two Post or relay racks tend to have a larger than normal opening, as do many other racks with round threaded holes. Square hole racks tend to be very close to the minimum opening (see FIG. 9C).

Front Panel Width

The only dimension on a 19" rack that actually measures 19" is the width of the mounting flange dimension E. The physical width F of the rack can vary significantly.

One who is familiar with the EIA 310-D standard will appreciate that the current revision "D" of the EIA 310 standard has made some small changes to the spacing distances of the EIA mounting apertures from the prior version "C" of the EIA 310 standard. These changes related to changes in United States law regarding conversion of US inch-based measurements to metric measurements. Applicant acknowledges that the current spacing requirements of the EIA mounting apertures may be changed from time to time in the future. Applicant's invention as described herein is compatible with current and future spacing requirements of the EIA Standard 310 and is compatible with other mounting aperture spacings not compliant with the EIA 310-D standard or future revisions thereto.

Existing wall-mountable racks that comply with EIA 310-D standard generally include racks having one of two mounting systems. The first is a front only mounting system for the equipment. The equipment is mounted to two posts and the weight of the equipment is either centered or cantilevered. Generally prior art wall-mountable racks have two types of frames, either open or closed. The prior art closed racks usually employ removable side panels to provide access to the equipment mounted therein. The most common racks are 7-8 feet tall and are free standing. These traditional prior art racks have varying rack mounting depths and internal depth for equipment. Early racks were 19-24 inches deep, as the equipment of the time was near that depth. More modern rack servers are 25-32 inches deep and require far deeper racks. There is still a significant amount of shallow equipment used in IT installations, including patch panels, switches and audio-visual equipment. These shallow boxes typically require 2-12 inches of depth.

Wall-mountable racks are desirable for several types of users. Prior art wall-mountable racks, due to their structural support method, have a depth that is typically limited to 24 inches with 12-18 inches being the most common depths. Such prior art wall mount racks are suitable for patch panels, switches and other shallow equipment. Wall-mountable racks are desirable because they can be placed in closets, back rooms, and other non-server room locations. Some prior art wall-mountable racks have only a front EIA standard mounting only. Some prior art wall-mountable racks pivot. Prior art wall-mountable racks suffer from at least two disadvantages: limited rack space and poor power distribution options. Patch panels and power distribution equipment either use valuable rack space or are mounted externally. Mounting power strips to an adjacent wall requires special mounting methods that are nonstandard and not off-the-shelf items.

Since rack space is a premium concern for users of wall-mountable racks, there is a need for a wall-mountable support rack with multiple mounting orientations.

SUMMARY

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2A is a perspective view of a first embodiment of a wall-mountable rack for supporting equipment shown in a second mounted position;

FIG. 2B is a top view of a first embodiment of a wall-mountable rack for supporting equipment shown in a second mounted position;

FIG. 2C is a front view of a first embodiment of a wall-mountable rack for supporting equipment shown in a second mounted position;

FIG. 2D is a side view of a first embodiment of a wall-mountable rack for supporting equipment shown in a second mounted position;

FIG. 5A is a perspective view of a first embodiment of a wall-mountable rack for supporting equipment shown in the first mounted position with equipment disposed in the rack;

FIG. 5B is a top view of a first embodiment of a wall-mountable rack for supporting equipment shown in first mounted position with equipment disposed in the rack;

FIG. 5C is a front view of a first embodiment of a wall-mountable rack for supporting equipment shown in first mounted position with equipment disposed in the rack;

FIG. 5D is a side view of a first embodiment of a wall-mountable rack for supporting equipment shown in first mounted position with equipment disposed in the rack;

FIG. 6A is a perspective view of a second embodiment of a wall-mountable rack for supporting equipment shown in a first mounted position;

FIG. 6B is a top view of a second embodiment of a wall-mountable rack for supporting equipment shown in a first mounted position;

FIG. 6C is a front view of a second embodiment of a wall-mountable rack for supporting equipment shown in a first mounted position;

FIG. 6D is a side view of a second embodiment of a wall-mountable rack for supporting equipment shown in a first mounted position;

FIG. 7A is a perspective view of a second embodiment of a wall-mountable rack for supporting equipment shown in the first mounted position with equipment disposed in the rack;

FIG. 7B is a top view of a second embodiment of a wall-mountable rack for supporting equipment shown in first mounted position with equipment disposed in the rack;

FIG. 7C is a front view of a second embodiment of a wall-mountable rack for supporting equipment shown in first mounted position with equipment disposed in the rack;

FIG. 7D is a side view of a second embodiment of a wall-mountable rack for supporting equipment shown in first mounted position with equipment disposed in the rack;

FIG. 8A is a perspective view of a second embodiment of a wall-mountable rack for supporting equipment shown in the first mounted position with equipment disposed in the rack;

FIG. 8B is a top view of a second embodiment of a wall-mountable rack for supporting equipment shown in second mounted position with equipment disposed in the rack;

FIG. 8C is a front view of a second embodiment of a wall-mountable rack for supporting equipment shown in second mounted position with equipment disposed in the rack;

FIG. 8D is a side view of a second embodiment of a wall-mountable rack for supporting equipment shown in second mounted position with equipment disposed in the rack.

FIG. 9A is a schematic illustrating the vertical spacing of the vertical rows of mounting apertures in a rack as specified in EIA-310D;

FIG. 9B is a schematic illustrating the horizontal spacing of the vertical rows of mounting apertures of a rack as specified in EIA-310D;

FIG. 9C is a schematic illustrating the width of a rack opening as specified in EIA-310D; and FIG. 9D is a schematic illustrating the mounting flange dimension of a rack as specified in EIA-310D.

Like reference symbols in the various drawings indicate like elements.

DETAILED DESCRIPTION

Various embodiments of the principles of the present invention are shown in FIGS. 1A-8D. The present invention comprises a wall-mountable rack for equipment, and associated method of assembly for the rack and a method for use for the rack. Exemplary equipment that may be mounted in the rack includes: power strips, patch panels, servers, tower computers, tape drives, hubs, switches, cabling and other equipment related thereto.

DEFINITIONS

As commonly understood in geometry, by definition, a square is a special form of a rectangle. Therefore, as used herein the term "rectangular cube" in the specification and claims is intended to encompass both a rectangular cube and a square cube. The terms upper, lower, right, left, side, front, back, top and bottom are for illustrative purposes. Such terms are not meant to restrict the member so described to that position. As will be further explained herein, the rack 100 of the present disclosure can be rotated horizontally such that the upper and lower members are positioned on the sides and/or rotated vertically such that the front becomes a side member.

Figure 1A:
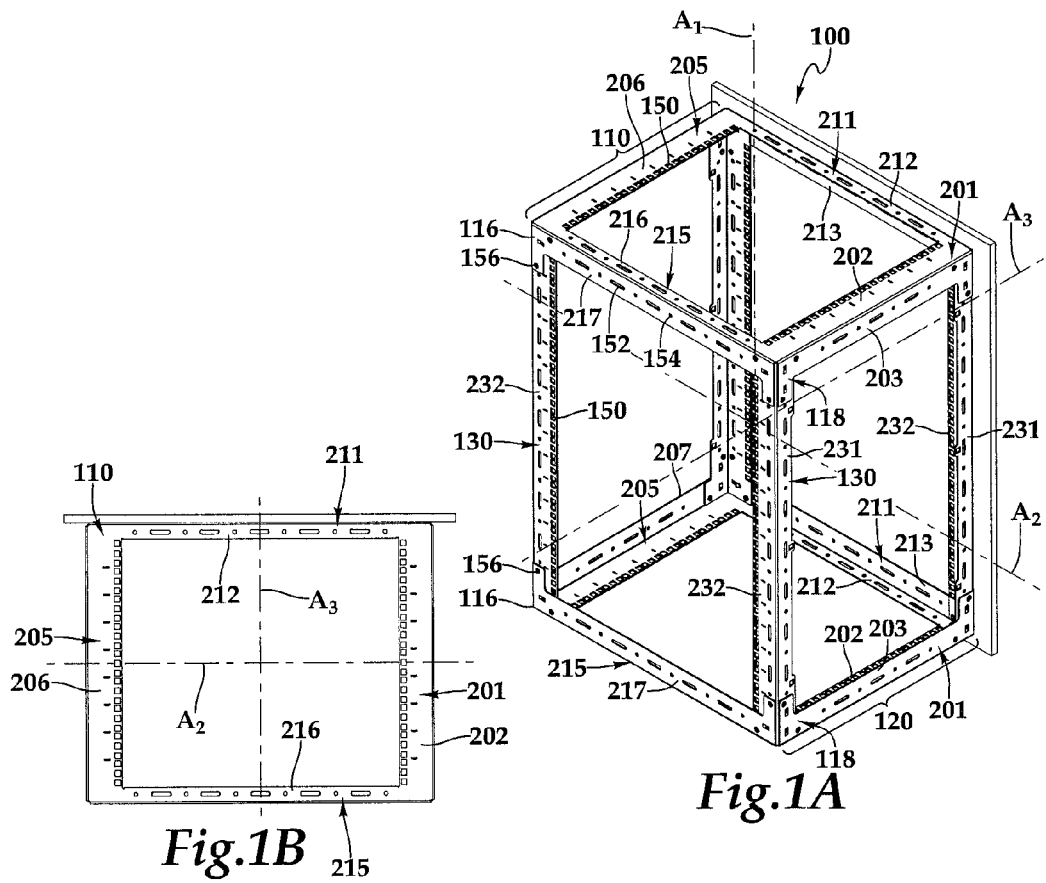
FIG. 1A is a perspective view of a first embodiment of a wall-mountable rack for supporting equipment shown in a first mounted position.
Figure 1B:
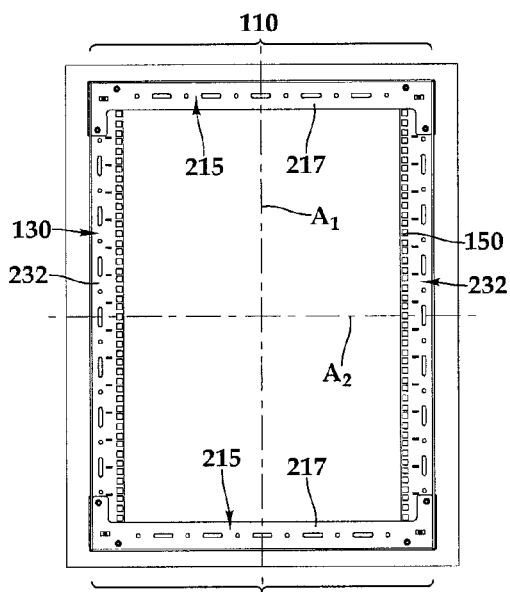
FIG. 1B is a top view of a first embodiment of a wall-mountable rack for supporting equipment shown in a first mounted position.
Figures 1C, 1D:
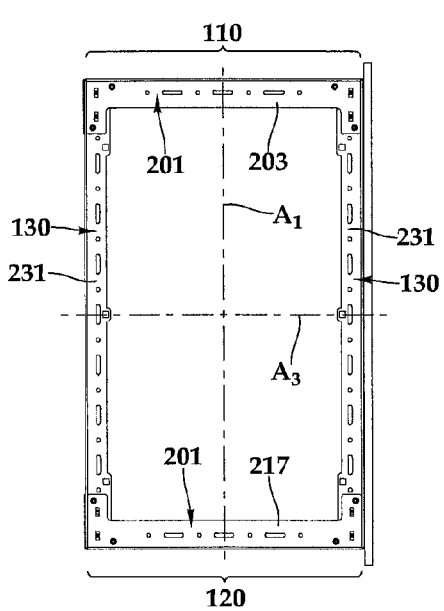
FIG. 1C is a front view of a first embodiment of a wall-mountable rack for supporting equipment shown in a first mounted position.
FIG. 1D is a side view of a first embodiment of a wall-mountable rack for supporting equipment shown in a first mounted position.

Referring now to FIGS. 1A-1D therein is illustrated a first embodiment of a wall-mountable rack for supporting equipment shown in a first mounted position. FIG. 1A is a perspective view and FIGS. 1B, 1C and 1D are top, front and side views thereof. A wall-mountable rack 100 for supporting equipment comprises a rectangular cube having linear edge members 201, 205, 211, 215 and 130. An upper rectangular member 110 is formed from four linear edge members 201, 205, 211 and 215. Each linear member 201, 205, 211 and 215 is joined at its end to another of the four linear edge members at substantially a 90 degree angle to form a corner 116 of the rectangular cube. Linear edge member 201 has a first planar flange 202 joined to a second planar flange 203 at substantially a 90 degree angle. Oppositely disposed linear edge member 205 has first planar flange 205 joined to a second planar flange 206 at substantially a 90 degree angle. Linear edge member 211 has first planar flange 212 joined to a second planar flange 213 at substantially a 90 degree angle. Oppositely disposed linear edge member 215 has first planar flange 216 joined to a second planar flange 217 at substantially a 90 degree angle. The upper rectangular member 110 includes a downwardly disposed leg portion 118 at each corner 116. Each leg 118 is configured to receive an end portion of a linear side member 130. Each of the four side members 130 has first planar flange 231 joined to a second planar flange 232 at substantially a 90 degree angle.

In a like manner, a lower rectangular member 110 is formed from four linear edge members 201, 205, 211 and 215. Each linear member 201, 205, 211 and 215 is joined at its end to another of the four linear edge members at substantially a 90 degree angle to form a corner 116 of the rectangular cube. Linear edge member 201 has a first planar flange 202 joined to a second planar flange 203 at substantially a 90 degree angle. Oppositely disposed linear edge member 205 has first planar flange 205 joined to a second planar flange 206 at substantially a 90 degree angle. Linear edge member 211 has first planar flange 212 joined to a second planar flange 213 at substantially a 90 degree angle. Oppositely disposed linear edge member 215 has first planar flange 216 joined to a second planar flange 217 at substantially a 90 degree angle. The lower rectangular member 110 includes an upwardly disposed leg portion 118 at each corner. Each leg 118 is configured to receive an end portion of the side member 130.

In a first embodiment the two oppositely disposed planar flange members 202 and 206 have a plurality of equipment mounting apertures 150. It will be understood that equipment mounting apertures 150 may be EIA mounting apertures as specified in EIA Standard 310-D (and its successor) and/or other mounting aperture configurations and spacings not compliant with the EIA 310 D standard. In a first embodiment each oppositely linear planar members 232 have a plurality of equipment mounting apertures 150. In a first mounting position, the first embodiment of the rectangular cube is oriented with its long axis A1 vertically and its short axis A2 oriented horizontally. In the first embodiment in the first mounting orientation the top, bottom, front and rear space of the rack 100 is provided for mounting equipment in equipment mounting apertures 150.

It will be noted that additional apertures 152 and 154 may be present in linear members 201, 205, 211, 215 and 130. Such apertures may be slots, holes or other configurations and may serve one or more of several functions. First, the openings 152 and 154 reduce the overall weight of the rack 100. Additionally, the openings 152 and 154 allow equipment to be coupled to the rack 100 via straps or other coupling mechanisms. Ventilation is accomplished, in part, via the openings 152 and 154. Additional connection apertures 156 may be provided to receive fasteners to couple side members 130 to the upper member 110 and lower member 120. Exemplary fasteners may include screws, bolts and nuts, and rivets.

It will be understood that upper member 110 and lower member 120 may be formed as an integral piece via molding or casting or may be stamped from a sheet and pressed and welded or fused at the corners 116. Likewise, side members 130 may be formed as an integral piece via molding or casting or may be stamped from a sheet and pressed and/or welded or fused at the linear edges.

Referring now to FIGS. 2A-2D, therein is illustrated a first embodiment of a wall-mountable rack 100 for supporting equipment shown in a second mounting position wherein the rack 100 is rotated 90 degrees clockwise about the long axis A1 from its first mounting position, such that the front is now a left side and the right side is now the front. FIG. 2A is a perspective view and FIGS. 2B, 2C and 2D are top, front and side views of the rotated position. Like reference numerals as described above illustrate the rotated second mounting position.

Figure 3A:
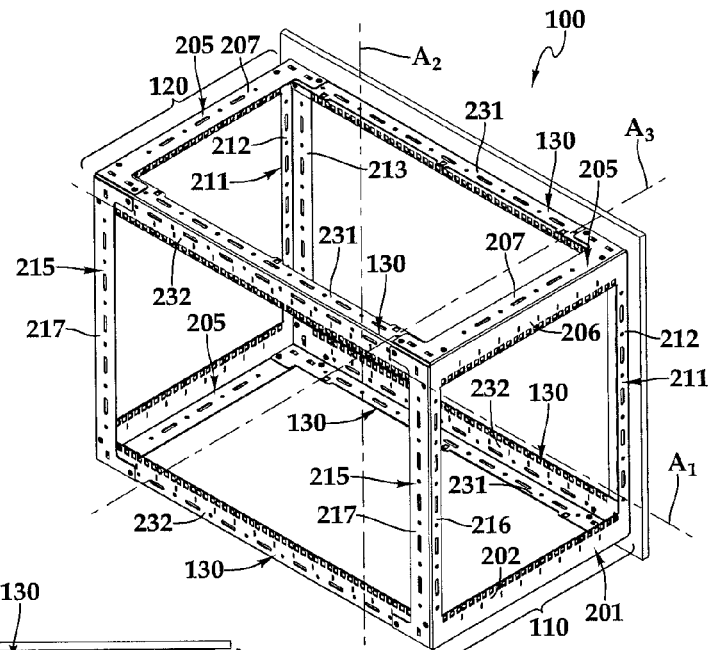
FIG. 3A is a perspective view of a first embodiment of a wall-mountable rack for supporting equipment shown in a third mounted position.
Figure 3B:
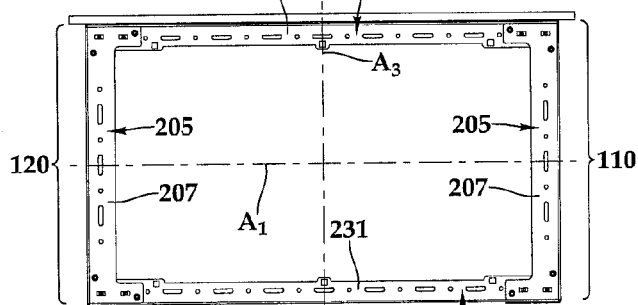
FIG. 3B is a top view of a first embodiment of a wall-mountable rack for supporting equipment shown in a third mounted position.
Figure 3C:
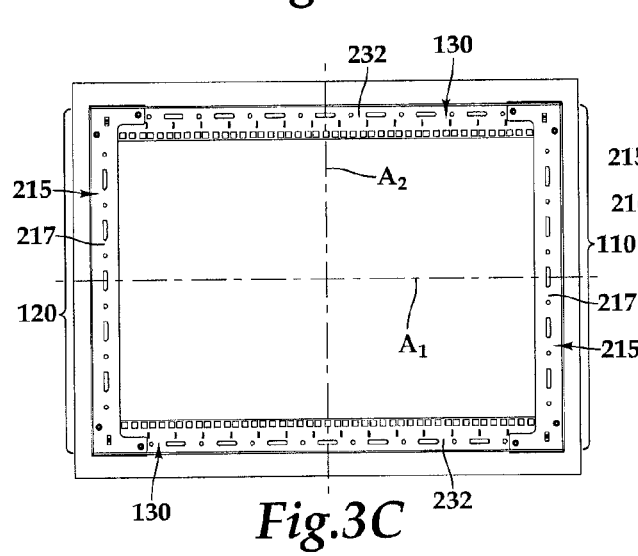
FIG. 3C is a front view of a first embodiment of a wall-mountable rack for supporting equipment shown in a third mounted position.
Figure 3D:
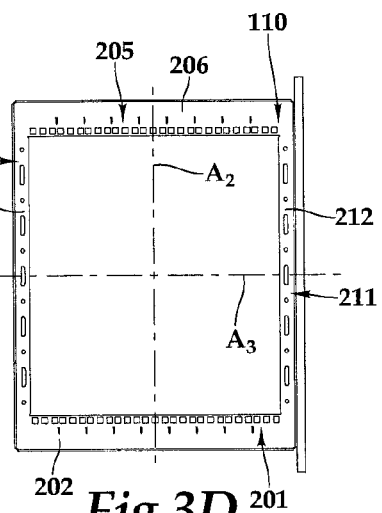
FIG. 3D is a side view of a first embodiment of a wall-mountable rack for supporting equipment shown in a third mounted position.

Referring now to FIGS. 3A-3D, therein is illustrated a first embodiment of a wall-mountable rack 100 for supporting equipment shown in a third mounting position wherein the rack 100 is rotated 90 degrees clockwise about the short axis A2 from its first mounting position such that the top is now the right side and the bottom is the left side and the front remains the front. FIG. 3A is a perspective view and FIGS. 3B, 3C and 3D are top, front and side views of the rotated position. Like reference numerals as described above illustrate the rotated third mounting position.

Figure 4A:
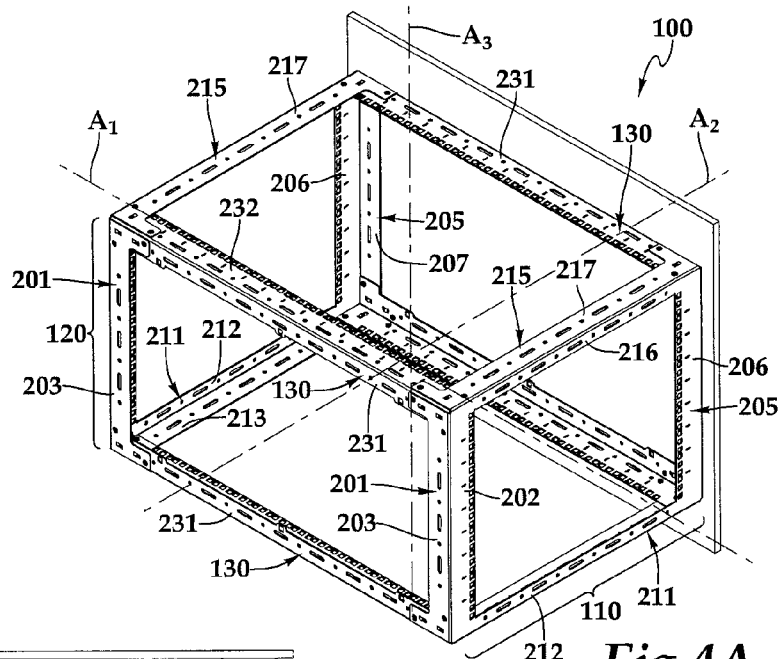
FIG. 4A is a perspective view of a first embodiment of a wall-mountable rack for supporting equipment shown in a fourth mounted position.
Figure 4B:
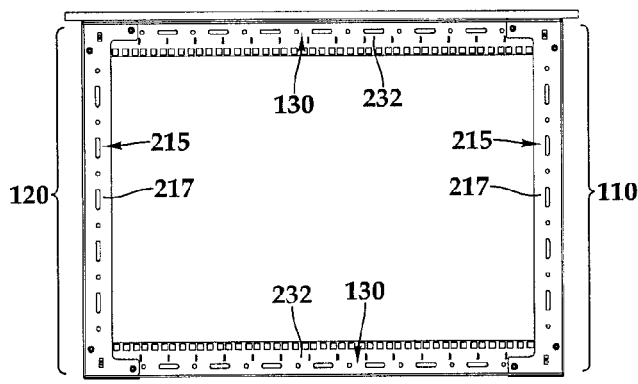
FIG. 4B is a top view of a first embodiment of a wall-mountable rack for supporting equipment shown in a fourth mounted position.
Figure 4C:
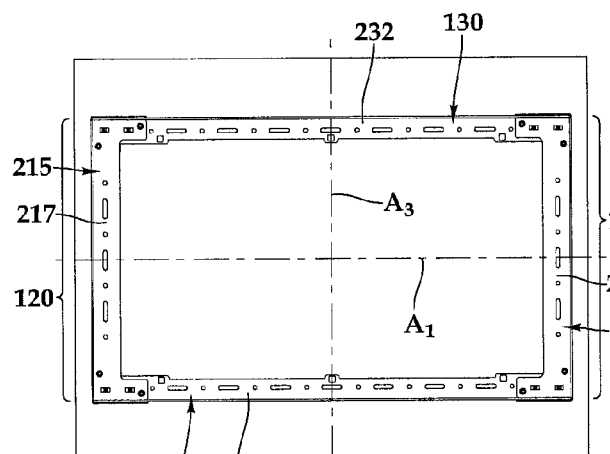
FIG. 4C is a front view of a first embodiment of a wall-mountable rack for supporting equipment shown in a fourth mounted position.
Figure 4D:
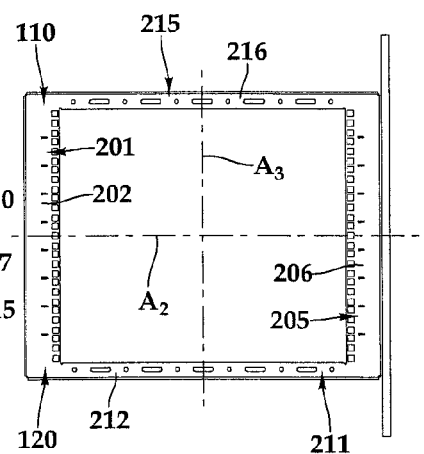
FIG. 4D is a side view of a first embodiment of a wall-mountable rack for supporting equipment shown in a fourth mounted position.

Referring now to FIGS. 4A-4D, therein is illustrated a first embodiment of a wall-mountable rack 100 for supporting equipment shown in a fourth mounting position wherein the rack 100 is rotated 90 degrees clockwise about the long axis A1 and 90 degrees clockwise about the short axis A2 from its first mounting position. FIG. 4A is a perspective view and FIGS. 4B, 4C and 4D are top, front and side views of the rotated position. Like reference numerals as described above illustrate the rotated fourth mounting position.

Referring now to FIGS. 5A-5D, therein is illustrated a first embodiment of the wall-mountable rack shown in a first mounted position as illustrated in FIGS. 1A-1D, now illustrated with various equipment mounted therein. FIG. 5A is a perspective view and FIGS. 5B, 5C and 5D are top, front and side views thereof. A power strip 510 is mounted in equipment apertures 150 disposed on flanges 202 and 206 of linear members 201 and 205 respectively of lower rectangular member 120. A plurality of patch panels 520 are mounted in equipment mounting apertures 150 disposed on flanges 202 and 206 of linear members 201 and 205 respectively of upper rectangular member 110. Various exemplary equipment 530 such as tape drives, tape back-ups, etc. are illustrated as mounted horizontally in equipment mounting apertures 150 disposed on flanges 232 of linear edge member 130. Filler panels 550 are disposed on the upper rectangular member 110 to fill in open unused space in the upper rectangular member. It will be understood that additional equipment could be mounted in unused space in the rack 100. It will be understood that the first embodiment of rack 100 may be oriented in any of the second, third and fourth mounting positions as illustrated in FIGS. 2A, 3A and 4A and various equipment may be mounted in rack 100 in any of these mounting positions.

Referring now to FIGS. 6A-6D, therein is illustrated a second embodiment of a wall-mountable rack 100 for supporting equipment shown in the first mounted position. FIG. 6A is a perspective view and FIGS. 6B, 6C and 6D are top, front and side views thereof. In this embodiment of the disclosure, equipment mounting apertures 150 are present on both flanges 231 and 232 of linear edge member 130. These additional equipment mounting apertures provide additional mounting positions for equipment and additional versatility for orientation of supporting equipment as illustrated in FIGS. 7A and 8A.

Referring now to FIGS. 7A-7D, therein is illustrated a second embodiment of the wall-mountable rack 100 shown in a first mounting position as illustrated in FIGS. 6A-6D, now illustrated with various equipment mounted therein. FIG. 7A is a perspective view and FIGS. 7B, 7C and 7D are top, front and side views thereof. A power strip 510 is mounted in equipment mounting apertures 150 disposed on flanges 202 and 206 of linear members 201 and 205 respectively of lower rectangular member 120. A plurality of patch panels 520 are mounted in equipment mounting apertures 150 disposed on flanges 202 and 206 of linear members 201 and 205 respectively of upper rectangular member 110. Various exemplary equipment 532 and 534 of different sizes and configurations such as tape drives, tape back-ups, etc., are illustrated as mounted horizontally in equipment mounting apertures 150 disposed on flanges 232 of linear edge members 130. Filler panel 550 is disposed on the upper rectangular member 110 to fill in open unused space in the upper rectangular member. Two servers 540 are mounted vertically in equipment mounting apertures 150 disposed on flanges 202 and 206 of linear members 201 and 205 respectively of upper rectangular member 110.

Referring now to FIGS. 8A-8D, therein is illustrated the second embodiment of the wall-mountable rack 100 shown in a first mounted position as illustrated in FIGS. 6A-6D, now illustrated with various equipment mounted therein. FIG. 8A is a perspective view and FIGS. 8B, 8C and 8D are top, front and side views thereof. A plurality of patch panels 520 are mounted in equipment mounting apertures 150 disposed on flanges 202 and 206 of linear members 201 and 205 respectively of upper rectangular member 110. Multiple servers 560 are mounted vertically in equipment mounting apertures 150 disposed on flanges 202 and 206 of linear members 201 and 205 respectively of upper rectangular member 110. Exemplary equipment 570 is mounted horizontally in equipment mounting apertures 150 disposed on flanges 231 of linear members 130.

It will be understood that additional equipment could be mounted in unused space in the rack 100. It will be understood that the second embodiment of rack 100 may be oriented in any of the second, third and fourth mounting positions as illustrated in FIGS. 2A, 3A and 4A, and various equipment may be mounted in rack 100 in any of these mounting positions.

The rack 100 of the present invention provides a number of advantages over the prior art wall-mountable racks. The rack 100 provides additional equipment mounting space at the rear of the rack over prior art designs (see FIGS. 5A and 7A). The design of rack 100 allows the rack to be mounted with either front facing rack space or right/left dual rack space (see FIGS. 8A-8D). The rack 100 is capable of multiple mounting orientations (see FIGS. 1A, 2A, 3A, 4A and 6A). This versatility in mounting for a single product is very desirable to customers and multiple mounting positions for a single rack reduce the inventory costs of stocking and distributing the rack 100 over prior art racks.

The rack 100 provides additional equipment mounting space at the top and bottom. Additional top and bottom equipment mounting space allows for mounting of common rack mount power strips 510 at the top or bottom in a space that does not consume valuable vertical rack space (see FIGS. 5A and 7A). The advantage of these rack mount power strips 510 is that they are standard off-the-shelf items. Since incoming power usually is routed from an outlet near the floor, bottom mounting provides a very convenient location for bringing power to the rack. Mounting the rack mount power strip 510 at the bottom, near the rear of the rack, with the outlets facing up, makes power cable routing to the internal equipment very efficient (see FIGS. 5A, 7A). The additional top and bottom equipment mounting space allows patch panels 520 to be mounted at the top or bottom instead of the valuable vertical space. Since incoming data cables usually are routed from the ceiling, top mounting provides a very convenient location for bringing data to the rack. Mounting the patch panel 520 at the top, near the rear of the rack, with the outlets facing down, makes data cable routing to the internal equipment very efficient, eliminating a mass of cables on the outside of the rack (see FIGS. 5A, 7A and 8A).

Unused space at the top and bottom of rack 100 can be easily covered, if unused, using common off-the-shelf filler panels 550. Since filler panels 550 are available in many different U heights, this handles the issue that the top or bottom covers would have to be available in many different sizes depending on the amount of space used at each installation. This also eliminates the necessity for custom cover, reducing inventory and distribution costs (see FIGS. 5A and 7A).

Additional top equipment mounting space in rack 100 provides a method of vertically mounting deeper equipment in the rack than is available in prior art racks. Deep equipment 540 and 560 (see FIGS. 7A and 8A) can be supported solely by the top equipment mounting space, or it can be four-post mounted to both the top and bottom equipment mounting space. Deep equipment 540 and 560 can be top mounted in the back, occupying available vertical space at the back of the rack. This leaves room for horizontally mounting equipment 530 and 570 in adjacent spaces or in spaces below (see FIG. 8A).

Additional equipment mounting space on the right and left allows for multi-dimensional rack mounting where shallow equipment can be mounted on the right, front and left of the rack (see FIG. 8A). This also allows shallow patch panels 570 to occupy the right and left while deeper equipment 520 is mounted vertically from 529 or horizontally from the front (not shown). It will be understood that filler side panels can be off-the-shelf filler panels as discussed above with regard to top panels 550.

The present disclosure includes a method for assembly of a wall-mountable rack 100 for supporting equipment. The rack 100 may be assembled in any number of manners. The following is one method of assembly. It will be understood that the steps following can be accomplished in different orders and the order in which they are described is not intended to be limiting. Provide four side members 130, each side member comprising a linear edge member having a first planar flange 231 joined to a second planar flange 232 at substantially a 90 degree angle and wherein at least one planar flange 232 of each said side members has a plurality of equipment mounting apertures 150; provide a preassembled upper rectangular member 110 comprising four linear edge members 201, 205, 211 and 215, each linear edge member having a first planar flange 202, 206, 212 and 216 joined to a second planar flange 203, 207, 213 and 217 (respectively) at substantially a 90 degree angle and wherein at least one planar flange 202, 206, 212 and 216 of each said side members has a plurality of equipment mounting apertures 150, and each linear member being joined at its end to another of the four linear edge members at substantially a 90 degree angle to form a corner 116, said upper rectangular member 110 having a downwardly disposed leg portion 118 at each corner, said leg adapted to receive an end portion of one of the side members 130, and wherein at least two opposing planar flanges 202 and 206, and 212 and 216 of opposing linear edge members of the upper rectangular member 110 have a plurality of equipment mounting apertures 150; providing a preassembled lower rectangular member 120 comprising four linear edge members 201, 205, 211 and 215, each linear edge member having a first planar flange 202, 206, 212 and 216 joined to a second planar flange 203, 207, 213, 217 (respectively) at substantially a 90 degree angle and wherein at least one planar flange 202, 206, 212, and 216 of each said side member has a plurality of equipment mounting apertures 150, and each linear member being joined at its end to another of the four linear edge members at substantially a 90 degree angle to form a corner 116, said lower rectangular member 120 having an upwardly disposed leg portion 118 at each corner 116, said leg adapted to receive an end portion of one of the side members 130, and wherein at least two opposing planar flanges 202 and 206, and 212 and 216 of opposing linear edge members of the upper rectangular member have a plurality of equipment mounting apertures 150; inserting a first end of each of the members 130 into a corresponding one of the legs 118 of the upper rectangular section 110; inserting the second end of each of the members 130 into a corresponding one of the legs 118 of the lower rectangular section 110; affixing each of said ends of said side members to each of said legs with a fastener, thereby forming a wall-mountable rack 100 comprising a rectangular cube having linear edge members.

A method of use of a wall-mountable rack 100 for supporting equipment. The rack 100 may be used in any number of manners. The following is one method of use. It will be understood that the steps following can be accomplished in different orders and the order in which they are described is not intended to be limiting. Provide an assembled wall-mountable rack 100 for supporting equipment as heretofore described in either the first or second embodiment; rotating the preassembled rack to any one of the four mounting positions as heretofore described; attaching to at least one equipment mounting aperture at least one piece of electrical equipment selected from the group of power strips and patch panels, servers, tower computers, tape drives, hubs and switches; attaching the wall-mountable rack 100 to a wall or other means of support.

It is to be appreciated that the rack 100 of the present invention may be mounted on a wall by any attachment method that will adequately support the load of the rack and equipment mounted therein. It is to be further appreciated that the rack 100 provides numerous configurations for supporting a variety of equipment, depending on the requirements of the user and dimensions of the equipment to be supported. The rack 100 may be used to accommodate use of the rack 100 with all manner of equipment capable of being mounted in equipment mounting apertures.

A number of embodiments of the invention have been described. Nevertheless, it will be understood that various modifications may be made without departing from the spirit and scope of the invention. Accordingly, other embodiments are within the scope of the following claims.

What is claimed is:

1. A wall-mountable rack for supporting equipment, said rack comprising:
   a rectangular cube having linear edge members, each of said edge members having a first planar flange joined to a second planar flange at substantially a 90 degree angle to create a substantially L shaped recess to receive said equipment, said rack further including:
   four side members, each side member comprising one of said linear edge members;
   an upper rectangular member comprising four linear edge members, each linear member joined at its end to another of the four linear edge members at substantially a 90 degree angle to form a corner of the rectangular cube, said corner adapted to receive an end portion of one of the side members;
   a lower rectangular member comprising four linear edge members, each linear edge member joined at its end to another of the four linear edge members at substantially a 90 degree angle to form a corner of the rectangular cube, said corner adapted to receive an end portion of one of the side members;
   wherein the first and second planar flanges of each of said side members have a plurality of equipment mounting apertures directly disposed thereon longitudinally along an entire length of the first and second planar flanges of each of said side members;
   wherein the first and second planar flanges of each of the linear edge members defined by the upper rectangular member have a plurality of equipment mounting apertures directly disposed thereon longitudinally along an entire length of the first and second planar flanges of each of the linear edge members defined by the upper rectangular member; and
   wherein the first and second planar flanges of each of the linear edge members defined by the lower rectangular member have a plurality of equipment mounting apertures directly disposed thereon longitudinally along an entire length of the first and second planar flanges of each of the linear edge members defined by the lower rectangular member.

2. The wall mountable rack of claim 1 wherein said upper rectangular member further includes a downwardly disposed leg portion at each corner, and said lower rectangular member further includes an upwardly disposed leg portion at each corner, and wherein each leg portion is adapted to receive an outside portion of the end portion of one of the side members.

3. The wall-mountable rack of claim 2 having at least two apertures disposed on at least the first and/or second planar flange of at least one of the linear members, said apertures adapted to receive a wall mounting fastener.

4. The wall-mountable rack of claim 1 being adapted to mount to a wall in a first orientation and being adapted to mount to a wall in a second orientation rotated 90 degrees from the first orientation.

5. The wall mountable rack of claim 1 being adapted to rotate 90 degrees about a longitudinal axis passing through a center point of internal rack space, and receive and secure equipment in opposing side faces and a top and a bottom face after the rack is rotated about the longitudinal axis.

6. The wall mountable rack of claim 1 being adapted to rotate 90 degrees about a lateral axis passing through a center point of internal rack space and perpendicular to the longitudinal axis, and receive and secure equipment in opposing side faces and a top and a bottom face after the rack is rotated about the lateral axis.

7. The wall mountable rack of claim 1 being adapted to rotate 90 degrees about a vertical axis passing through a center point of internal rack space, and receive and secure equipment in opposing side faces and a top and a bottom face after the rack is rotated about the vertical axis.

8. The wall-mountable rack of claim 1 wherein the equipment mounting apertures are adapted to support electrical equipment selected from the group consisting of: power strips and patch panels.

9. The wall-mountable rack of claim 1 wherein the equipment mounting apertures are adapted to support electrical equipment selected from the group consisting of: servers, desk top computers, towers, tape drives, hubs and switches.

10. The wall-mountable rack of claim 1 wherein each of the side members is attached to the top rectangular member with a removable fastener.

11. The wall-mountable rack of claim 1 wherein each of the side members is attached to the lower rectangular member with a removable fastener.

12. The wall-mountable rack of claim 1 wherein the mounting apertures are EIA mounting apertures.

13. A wall-mountable rack for supporting equipment, said rack comprising:
- a rectangular cube having linear edge members, each of said edge members having a first planar flange joined to a second planar flange at substantially a 90 degree angle, and wherein said rack further includes:
- four side members, each side member comprising one of said linear edge members;
- an upper rectangular member comprising four linear edge members, each linear member joined at its end to another of the four linear edge members at substantially a 90 degree angle to form a corner of the rectangular cube, said corner adapted to receive an end portion of one of the side members;
- a lower rectangular member comprising four linear edge members, each linear edge member joined at its end to another of the four linear edge members at substantially a 90 degree angle to form a corner of the rectangular cube, said corner adapted to receive an end portion of one of the side members;
- wherein the first and second planar flanges of each of said side members have a plurality of equipment mounting apertures disposed longitudinally along the first and second planar flanges of each of said side members;
- wherein the first and second planar flanges of each of the linear edge members defined by the upper rectangular member have a plurality of equipment mounting apertures disposed longitudinally along the first and second planar flanges of each of the linear edge members defined by the upper rectangular member;
- wherein the first and second planar flanges of each of the linear edge members defined by the lower rectangular member have a plurality of equipment mounting apertures disposed longitudinally along the first and second planar flanges of each of the linear edge members defined by the lower rectangular member; and
- said upper rectangular member further includes a downwardly disposed leg portion at each corner, and said lower rectangular member further includes an upwardly disposed leg portion at each corner, and wherein each leg portion is adapted to receive an outside portion of the end portion of one of the side members.

14. The wall-mountable rack of claim 13, wherein the plurality of equipment mounting apertures on the first and second planar flanges of each of said side members are directly disposed longitudinally along an entire length of the first and second planar flanges of each of said side members.

15. The wall-mountable rack of claim 13, wherein the plurality of equipment mounting apertures on the first and second planar flanges of each of the linear edge members defined by the upper and lower rectangular members are directly disposed longitudinally along an entire length of the first and second planar flanges of each of the linear edge members defined by the upper and lower rectangular members.

\* \* \* \* \*